United States Patent [19]

Howe et al.

[11] Patent Number: 5,373,513
[45] Date of Patent: Dec. 13, 1994

[54] SHIFT CORRECTION CODE SYSTEM FOR CORRECTING ADDITIVE ERRORS AND SYNCHRONIZATION SLIPS

[75] Inventors: Dennis G. Howe, Pittsford, N.Y.; Hugh M. Hilden; Edward J. Weldon, Jr., both of Honolulu

[73] Assignee: Eastman Kodak Company, Rochester, N.Y.

[21] Appl. No.: 745,788

[22] Filed: Aug. 16, 1991

[51] Int. Cl.$^5$ .................. G06F 11/00; H03M 13/00; H04L 1/00
[52] U.S. Cl. ....................... 371/42; 371/55; 371/47.1; 371/65; 341/59; 341/94
[58] Field of Search ............. 371/42, 59, 94, 55, 371/47.1, 65; 360/38.1, 46; 358/314, 336

[56] References Cited

U.S. PATENT DOCUMENTS

| | | | |
|---|---|---|---|
| 4,059,825 | 11/1977 | Greene | 340/146.1 |
| 4,253,185 | 2/1981 | Danielsen | 375/20 |
| 4,754,457 | 6/1988 | Bright et al. | 371/47 |
| 4,807,231 | 2/1989 | Sato | 371/55 |

Primary Examiner—Robert W. Beausoliel, Jr.
Assistant Examiner—Phillip F. Vales
Attorney, Agent, or Firm—Raymond L. Owens

[57] ABSTRACT

In a shift correction decoder which processes d,k-constrained RLL data that is encoded in accordance with a shift correction code whose symbols in GF(p) comprise modulo p reductions of cumulative sums of successive run symbols of the RLL data (where p is an odd prime), additive errors (i.e., drop-out and drop-in errors) in the received RLL data are corrected by relying in part on information pertaining to the sequence of the polarities of successive 1-bits in the received RLL data. The polarity information is used to either insert missing 1-bits (due to drop-outs) or delete spurious 1-bits (due to drop-ins) and specify to the shift correction decoder the location of an additive error as an erasure. Synchronization slips are corrected by pre-multiplying the received codeword polynomial by a factor which reduces to two the number of errors created by a single synchronization slip. GF(p) is selected such that $p \leq k-d+1$ and the minimum distance of the shift correction code is selected to be sufficient to enable correction of a limited number of shift errors, additive errors and synchronization slips within one received codeword.

31 Claims, 7 Drawing Sheets

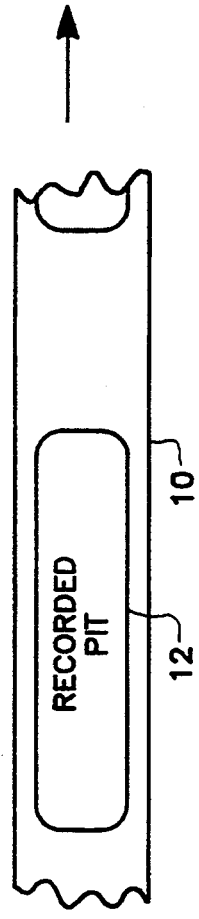
FIG. 1a (PRIOR ART)
FIG. 1b (PRIOR ART)
FIG. 1c (PRIOR ART)
FIG. 1d (PRIOR ART)
FIG. 1e (PRIOR ART)
FIG. 1f (PRIOR ART)

TRANSMITTED RUN SEQUENCE : $-3,6,-4,5,\cdots = -X_0, X_1, -X_2, X_3, \cdots$

TRANSMITTED SUM SEQUENCE : $3,9,13,18,\cdots = S_0, S_1, S_2, S_3, \cdots$ $(S_0 = |X_0| \text{ AND } S_i = \sum_{j=0}^{i} |X_j|; i>0)$ RUN SEQUENCE WITH DROP-OUT AT $X_2$ : $-3, 10, 5, \cdots = -X_0, (X_1+X_2), X_3, \cdots$ $(X_f = X_1 + X_2)$ FLIP 0-BIT NEAR CENTER OF RUN
FRAMED BY IDENTICAL POLARITY PEAKS : $-3, 5, -5, 5, \cdots = -X_0, X_x, -(X_1+X_2-X_x), X_3, \cdots$ SUM SEQUENCE CORRESPONDING TO
RUN SEQUENCE WITH FLIPPED BIT : $3, 8, 13, 18, \cdots = S_0, S_x, S_2, S_3, \cdots$

FIG. 5

TRANSMITTED RUN SEQUENCE : $-3, 6, -4, 5, \cdots = -X_0, X_1, -X_2, X_3, \cdots$ TRANSMITTED SUM SEQUENCE : $3, 9, 13, 18, \cdots = S_0, S_1, S_2, S_3, \cdots$ RUN SEQUENCE WITH OPPOSITE
POLARITY DROP-IN IN $X_1$ : $-3, 3, -3, -4, 5, \cdots = -X_0, X_1^*, -X_1^{**}, -X_2, X_3, \cdots$
($X_f = -X_1^{**}$)

FLIP 1-BITS AT BEGINNING
AND END OF $X_f$ : $-3, 10, 5, \cdots = -X_0, X_1 + X_2, X_3, \cdots$
($X_f = X_1 + X_2$)

FLIP 0-BIT NEAR CENTER OF $X_f$ : $-3, 5, -5, 5, \cdots = -X_0, X_x, -(X_1 + X_2 - X_x), X_3, \cdots$ SUM SEQUENCE CORRESPONDING
TO LAST RUN SEQUENCE : $3, 8, 13, 18, \cdots = S_0, S_x, S_2, S_3, \cdots$

*FIG. 6*

TRANSMITTED RUN SEQUENCE : $-(d+1), k+1, -x_2, x_3, \ldots$

TRANSMITTED SUM SEQUENCE : $d+1, d+k+2, d+k+2+x_2, d+k+2+x_2+x_3, \ldots$

RUN SEQUENCE WITH SAME POLARITY DROP-IN IN $X_1$ :
$(X_f = (d+1))$
$-(d+1), d+1, k-d, -x_2, x_3, \ldots$ FLIP 1-BITS AT BEGINNING AND END OF $X_f$ :
$(X_f = (d+k+2))$
$-(d+k+2), -x_2, x_3, \ldots$ FLIP 0-BIT NEAR CENTER OF $X_f$ : $-(\frac{d+k}{2}+1), (\frac{d+k}{2}+1), -x_2, x_3, \ldots$ SUM SEQUENCE CORRESPONDING TO LAST RUN SEQUENCE :
$(S_X = \frac{d+k}{2}+1)$
$\frac{d+k}{2}+1, d+k+2, d+k+2+x_2, d+k+2+x_2+x_3, \ldots$

FIG. 7

SHIFT CORRECTION CODE SYSTEM FOR CORRECTING ADDITIVE ERRORS AND SYNCHRONIZATION SLIPS

BACKGROUND OF THE INVENTION

1. Technical Field

The invention is an improvement to a class of shift error correcting modulation codes which are uniquely adapted to correct shift errors in run length limited (RLL) channel encoded data. The improvement achieved in the present invention enables a decoder employing such a code to correct not only shift errors but also additive errors and errors due to synchronization slips as well.

2. Background Art (A.) Shift Correcting Modulation Codes

Shift error correcting modulation codes were first disclosed in U.S. patent application Ser. No. 07/200,166 filed May 31, 1988 entitled "Shift Correction Code for Channel Encoded Data" by Dennis George Howe et al. and assigned to the assignee of the present application. As understood in that application as well as the present application, the term "shift error" in RLL encoded data refers to an error generated by the shifting of the position of any one of the 1's ("start bits") in a binary RLL sequence such as

10001000000100010000001.

If for example the second 1 in the foregoing sequence were shifted by one bit position to the "right", the sequence would change to

10000100000100010000001.

In the foregoing example, the sequence containing the shift error is obtained by adding (modulo 2) the binary error pattern

00001100000000000000000 to the original RLL binary sequence. We note that this error pattern has weight two, i.e., it contains exactly two non-zero bits.

The foregoing original and shift error corrupted binary RLL sequences may also be expressed as sequences of "runs" (a binary RLL sequence run consists of a 1 ("start bit") and all the contiguous zeros ("run bits") that immediately follow it and is denoted by an integer value ranging from $d+1$ to $k+1$ in a d,k-constrained RLL code). Expressing the above binary RLL sequences as sequence of runs we obtain for the original sequence 4, 7, 4, 7 and for the shift error corrupted sequence 5, 6, 4, 7.

Thus, in the foregoing example, the single shift error changed the run length (or run value) of two RLL runs (or "RLL symbols"), namely the first run whose length was increased, and the second run whose length was decreased by this error. Thus, the effect of a single shift error is essentially double that of other types of simple errors in that it corrupts two symbols (i.e., two bits or two runs) and therefore requires twice the redundant encoding overhead of prior art error correction codes for successful decoding, a significant problem.

As described in the referenced patent application, shift error correcting modulation codes solve this problem by transforming run sequences to cumulative sum sequences prior to shift correction encoding. This transformation reduces the effect of a shift error, i.e., it ensures that a shift error corrupts only one code symbol instead of two. To see this, consider the original and shift error corrupted run sequences of the above example: the original run sequence was $$\{x_0, x_1, x_2, x_3\} = \{4, 7, 4, 7\}$$

and its corresponding cumulative sum sequence is $$\{s_0, s_1, s_2, s_3\} = \{4, 11, 15, 22\}.$$

(Note: the sum elements are calculated using $$s_0 = x_0 \text{ and } s_i = \sum_{j=0}^{i} x_j, i > 0 \bigg).$$

The shift error corrupted run sequence was $$\{x_0, x_1, x_2, x_3\} = \{5, 6, 4, 7\}$$

and its corresponding sum sequence is $$\{s_0, s_1, s_2, s_3\} = \{5, 11, 15, 22\}.$$

Clearly, only one element of the sum sequence, not two, was affected by the shift error. This is relevant to shift error correction coding because the symbols on which shift error correction codes are formed are mod p reductions of the cumulative sum sequence elements (where p is an odd prime).

We now give a brief review of shift error correction coding. The RLL channel encoded data is divided into message blocks. A check block of RLL data is generated for each message block in accordance with the shift error correction modulation code; this check block is appended to the message block. When the shift correction encoded RLL data is played back or received, a shift correction decoder uses the check block information to locate and correct shift errors in the entire code block, which is comprised of both the message and check blocks. The shift correction code employed requires less redundant encoding overhead than prior art error correction codes to correct a single shift error.

In essence, the check block of RLL data is computed in accordance with the shift correction code by transforming the value of each message RLL run symbol, called an x-space symbol, in accordance with a transformation in which each RLL run symbol value is summed with the preceding run symbol values in the message block. The resulting transformed symbols, called s-space (sum space) symbols, are then reduced modulo p to generate s'-space symbols, where p is an odd prime number defining a Galois field GF(p). If only single shift errors may occur, it suffices if p=3, which is the number of shift error possibilities for each RLL run symbol, namely, (0) no shift and therefore no error, (1) forward or "right-ward" shift and (−1), or equivalently (2), backward or "left-ward" shift. The message block of s'-space symbols thus produced are then encoded in accordance with a code (called the "base" code) over GF(p) using well-known encoding techniques to generate a check block of redundant s'-space check symbols. Together, the message block and check block of s'-space symbols comprise a logical codeword of the GF(p) base code. The s'-space check symbols are then transformed back to x-space check symbols essentially by using the inverse of the x-space-to-s-space transformation mentioned above. The x-space check symbols are then transformed to RLL binary data and appended to the corresponding message block of RLL data to form a complete block of RLL data which is a physical representation of the logical codeword. The RLL data has thus been shift correction encoded.

Upon receiving the complete block of the shift correction encoded RLL data, the shift correction decoder uses the foregoing encoding process—or one very similar to it—to transform each of the received x-space message and check symbols to corresponding s'-space symbols. The syndrome of the resulting block of s'-space symbols with respect to the GF(p) base code is then computed (using any method for obtaining such a syndrome) and used to locate and correct (again, using conventional techniques) any erroneous s'-space symbols in the block. The corrected logical codeword (s'-space) is finally transformed to x-space, thus correcting shift errors occurring in the received RLL message block data. The number of single-place shift errors which may occur in a received RLL data block without surpassing the capability of the code is given by the largest integer contained in $(d_{min}-1)/2$, where $d_{min}$ is the minimum distance of the chosen base code. The permissible number of RLL bit positions which a correctable shift error may encompass may be increased by increasing p in GF(p).

(B.) Limitations Of Shift Correction Modulation Codes

Such shift correction channel modulation codes fail if one of the 1's in the binary RLL data is corrupted so as to appear as a 0 in the received data. Such an error is referred to as a "drop-out" error. These codes also fail if one of the 0's in the binary RLL data is corrupted so as to appear as a 1 in the received data. Such an error is referred to as a "drop-in" error. Generically, drop-in and drop-out errors are referred to as "additive" errors. Even in the absence of such additive errors, the shift correction channel modulation code fails if the read electronics suffers a synchronization problem that causes it to miscount the number of received bits in an RLL run symbol. In this case, the data is corrupted such that the number of 0's in the effected RLL run is increased or decreased from the true number. An increase from the true number of 0's in the run is referred to as a synchronization gain, while a decrease is referred to as a synchronization loss. Generically, synchronization losses and synchronization gains are referred to as "synchronization slips".

The effect of a drop-in error is to apparently add a spurious run symbol by splitting an existing run symbol into two RLL runs. For example, the RLL sequence

1000100001000001 may be corrupted by changing the middle binary 0 in the last run to a 1, as follows:

1000100001001001.

If the RLL code employed is a 2, 7 code (i.e., the number of 0's between successive 1's must be at least 2 and no greater than 7), then there are no RLL constraint violations in the corrupted sequence and the error cannot be located.

The effect of a drop-out error is to apparently remove a run symbol by converting the 1 which begins a run to a 0, so that a pair of run symbols become one symbol. For example, the RLL sequence

1000100100001 may be corrupted by changing the 1 which is second from the left to a 0, as follows:

1000000100001.

Again, if the RLL code employed is a 2,7 code, then there are no RLL constraint violations in the corrupted sequence and the error cannot be located. The effect of all such additive errors (drop-in as well as drop-out errors) is to change the apparent number of run symbols in the received block of RLL data (if the block boundaries are determined by counting RLL bits), or alternatively, the length of the RLL data sequence that corresponds to the received block is altered (if the block boundaries are determined by counting runs). Either of these events could cause catastrophic shift error correction decoding failures to occur.

The effect of a synchronization slip is to change the value of one RLL run symbol. For example, the RLL sequence

1000100001000001 may be corrupted by a synchronization loss by removing a zero from the last run, as follows:

100010000100001.

The effect of a synchronization slip is to corrupt all of the succeeding s'-space symbols in the corresponding shift correction codeword, as will be explored below in greater detail. For example, if the synchronization slip occurs in the very first symbol of the block, then all of the symbols in the corresponding shift correction codeword will be erroneous, which is another catastrophic event so far as shift error correction decoding is concerned.

Thus it would appear that there is a need for a shift error correction modulation code which corrects not only shift errors but also corrects either or both additive errors and synchronization slip-induced errors.

SUMMARY OF THE INVENTION

The shift error correction modulation code system is improved in the present invention so as to correct additive errors and (or) synchronization slips as well as correcting shift errors.

(A.) Correcting Additive Errors

Read waveform polarity information is used to locate any additive error to within k-d+1 bits. The type of additive error (i.e., drop-in or drop-out) is then determined from the run lengths (values) of the RLL runs that are in the immediate proximity of the additive error. Then, within the k-d+1 bits containing the additive error, either a selected 0-bit is flipped to a 1-bit in the case of a drop-out error, or a selected 1-bit is flipped to a 0-bit in the case of a drop-in error. Selection of the bit to be flipped is governed only by the constraint that the resulting change in the RLL data sequence not violate the (d,k) constraints of the RLL code. Changing the value of a single bit in this manner will change the value of two contiguous runs of the original transmitted RLL sequence (the run starting with the added 1-bit and its newly created immediate predecessor; or the elongated run containing the new 0-bit and its predecessor), but will affect only one sum symbol. The location of the single affected sum symbol is flagged to the shift correction decoder as an erasure. The shift correction decoder then precisely corrects the additive error, using the erasure flag as an error location in constructing its error locator polynomial, using well-known techniques. Since the order p of the Galois field of the code is at least $k-d+1$, the error vector computed by the decoder can specify any one of the $k-d+1$ possible bit locations in each RLL run symbol.

The information used by the present invention to accomplish the erasure declaration is the polarity of the succession of peaks in the playback signal; these peaks correspond to the locations of 1's in the binary RLL data. If correctly played back, the polarities of the peaks alternate between positive and negative. This is true for both magnetic data storage and optical recording data storage systems that use pulse width modulated recording (i.e., mark edge recording), as will be discussed below. Any occurrence of two successive peaks of the same polarity breaks the alternating polarity sequence and indicates the presence of a single additive error.

The type of additive error is determined by inspecting the lengths of the three RLL run symbols in the neighborhood of the polarity violation, specifically, the run that occurs between the two peaks having the same polarity and the runs that immediately precede and succeed it. If any of these violate the d,k constraints of the RLL code, then whether a drop-in or drop-out has occurred is discernable by inspection (a drop-in will produce a d-constraint violation; a drop-out will yield a k-constraint violation). If no d,k-constraint violation occurs, one inspects the second of these three runs; if the length is greater than or equal to $k-d+1$ and also greater than $2d+1$, then the additive error is a drop-out. If the length is less than or equal to $2d+1$ and less than $k-d+1$, then the additive error is a drop-in. This latter technique only works if an RLL code is chosen whose d,k-constraints satisfy the following inequality:

$$k+1 < 3(d+1). \tag{1}$$

In order to correct additive errors, the order p of the Galois field over which the base code of the shift correction code is defined must be at least as great as the number of possible run values of the RLL code. In other words, for a d,k-constrained RLL code, $p \geq k-d+1$. Furthermore, in order to correct as many as $e_s$ single shift errors and $e_a$ additive errors in the same block, the shift correction code must employ a sufficient number r of redundant check symbols in each codeword of N symbols so that the minimum distance $d_{min}$ of the shift correction code satisfies the following inequality:

$$d_{min} > 2e_s + e_a. \tag{2}$$

(B) Correcting Synchronization Slips

In order to correct synchronization slips, the received shift correction codeword polynomial C(z) is pre-multiplied by $(z-1)$. The syndrome of the resulting product with respect to the code generator polynomial is then computed to locate and correct any shift errors and synchronization slips. Any combination of (a) a single synchronization slip, (b) $e_a$ additive errors and (c) $e_s$ shift errors may be corrected in a block of data corresponding to one shift correction codeword, provided the shift correction code employs a sufficient number r of redundant check symbols in each codeword of N symbols so that the minimum distance $d_{min}$ of the shift correction code satisfies the following inequality:

$$2e_a + 4e_s + 4 < d_{min}. \tag{3}$$

By increasing p, the order of the symbol field of the shift error correction code, and by increasing the number r of check symbols in each codeword of N symbols, additive errors which are located via playback waveform peak polarity violations are corrected by the shift correction code and synchronization slips are corrected by the shift correcting code via a codeword pre-multiplication step.

Finally, isolated shift errors, additive errors or synchronization slips (or a combination of such isolated error events) may be corrected by the techniques taught in this invention. By isolated we mean that if any of these error events occur, another of these events does not occur within $k+1$ channel bits, where k is one of the constraints of the RLL code.

BRIEF DESCRIPTION OF THE DRAWINGS

The invention is described below in detail by reference to the accompanying drawings, of which:

FIGS. 1a through 1f are diagrams illustrating how RLL data is recovered from optical recording media;

FIG. 5 is a diagram illustrating the operation of the invention in the case of a drop-out error;

FIG. 6 is a diagram illustrating the operation of the invention in the case of one type of drop-in error;

FIG. 7 is a diagram illustrating the operation of the invention in the case of a second type of drop-in error.

DETAILED DESCRIPTION OF THE INVENTION

(A) Prior Art Data Recording Techniques

Referring to FIG. 1a, data is recorded on optical media 10 as a series of depressions or pits 12 formed by local heating due to a tightly focused laser beam, for example. Subsequent scanning across the optical medium 10 produces the playback optical signal of FIG. 1b. The starting and stopping locations of the pit 12 are found by taking the derivative with respect to time of the playback signal of FIG. 1b, to produce the differential signal of FIG. 1c. The signal of FIG. 1c comprises alternating positive and negative polarity peaks. The displacement between successive positive and negative peaks in the signal of FIG. 1c defines the length of each corresponding run of the RLL data in the channel data sequence illustrated in FIG. 1d. By rectifying the signal of FIG. 1c and using the rectified peak locations, one obtains the detected data signal of FIG. 1e, corresponding to the binary run length limited encoded data sequence of FIG. 1f.

In the case of magnetic recording media, FIG. 1c corresponds to the output of the magnetic playback head. Thus, FIGS. 1c through 1f apply to magnetic data recording as well as optical data recording. In both cases, prior to the conversion to binary data, the playback process produces the bi-polar signal of FIG. 1c having successive peaks of alternating polarity. The present invention uses the alternating polarity inherent in the sequence of playback signal peaks of FIG. 1c to identify the general location of additive RLL data errors, as will be described below.

(B) Shift Correction Modulation Encoder

Figure 2:
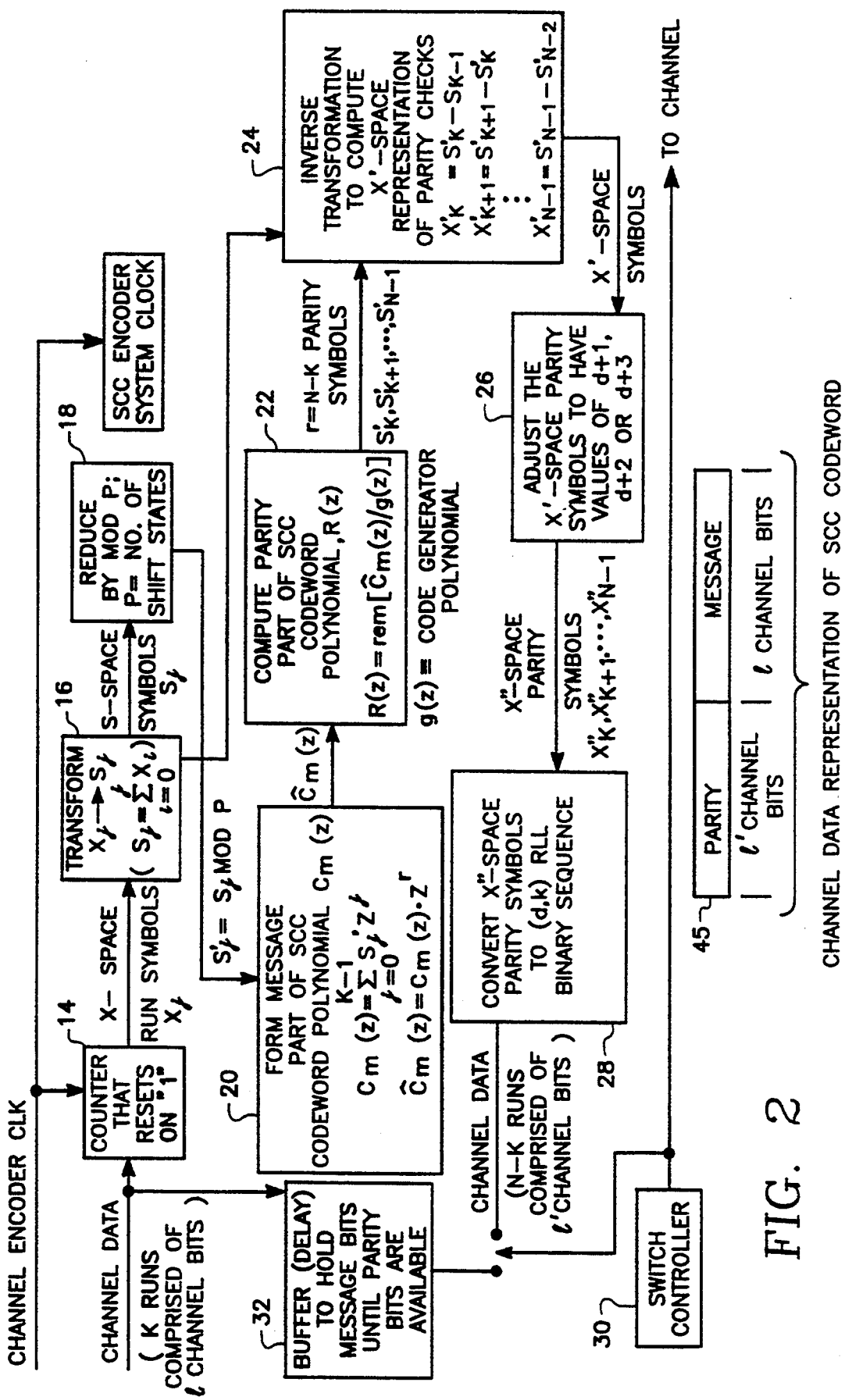
FIG. 2 is a block diagram illustrating the shift correction encoder employed in the present invention.

The present invention is an improvement to systems for playing back or "decoding" data previously recorded or "encoded" by the shift correction encoder illustrated in FIG. 2. The encoder of FIG. 2 is the same as that first described in the above-referenced patent application, and uses the same shift correction code, with the exceptions that: (a) the order p of the Galois field of the code is at least $k-d+1$ (the number of run lengths the d,k-constrained RLL code used to channel encode the data) and (b) the minimum distance of the code is constrained not only by the number of shift errors to be corrected but also by the number of additive errors to be corrected and synchronization slips to be corrected, as will be explored below. Aside from these differences, the function of the encoder of FIG. 2, as previously described in the referenced patent application will now be briefly reviewed for the convenience of the reader.

Each "message" block of K runs of binary RLL channel encoded user data which is to be encoded in accordance with the shift correction code is converted to a block of x-space symbols (each symbol being equal to the length of the corresponding RLL run) by an up-counter 14 which resets upon the passage of each binary 1 in the RLL data. The x-space symbols are transformed to s-space symbols by a transform processor 16 by computing the sum of each x-space symbols with all of its predecessors in the same block. A modulus-p processor 18 then reduces each one of the s-space symbols modulo p to produce a message block of s'-space symbols. The s'-space symbols are elements of the Galois field GF(p) of the shift correction code. A codeword processor 20 treats the message block of s'-space symbols as the message portion of a codeword polynomial C(z). A parity symbol generator 22 divides the polynomial $C(z) \cdot z^r$ by the codeword generator polynomial g(z) of the shift correction code ($r = N - K$ is the number of parity checks). The parity symbol generator 22 outputs the algebraic coefficients of the remainder of this division. These coefficients are the s'-space check symbols which, if appended to the message block of s'-space symbols, form a codeword of the shift correction code.

An inverse transform processor 24 transforms the check symbols to x'-space symbols using the inverse of the transformation performed by the transform processor 16. The x'-space symbols are then transformed by an adjust processor 26 to x"-space symbols by adjusting their values to be a corresponding one of $d+1$, $d+2$ or $d+3$. The x"-space symbols are then converted to a check block of RLL encoded data by an RLL data generator 28. A switch controller 30 appends the check block of RLL data to the message block of RLL data held in a buffer 32 to form a complete block of shift correction encoded RLL data. This data is then recorded on and subsequently read from the media in accordance with the well-known techniques previously discussed with reference to FIGS. 1a through 1f.

As described in the above-referenced patent application, a significant advantage of the shift correction encoding process performed by the encoder of FIG. 2 is that each shift error (in which a 1 in the binary RLL data exchanges places with one of the 0's therein) affects only one symbol of the corresponding shift correction codeword. The code is therefore ideal for correcting shift errors. However, as will be seen below, by setting the order p of the code's Galois field GF(p) to be at least the dimension $k-d+1$ of the d,k-constrained RLL code and by increasing the number r of check symbols in each shift correction codeword of N symbols, the code can also correct additive errors by using playback waveform peak polarity sequence violation informnation and can correct synchronization slips as well.

(C) Additive and Synchronization Error Correcting Shift Correction Decoder

1. Brief Overview

Figure 3:
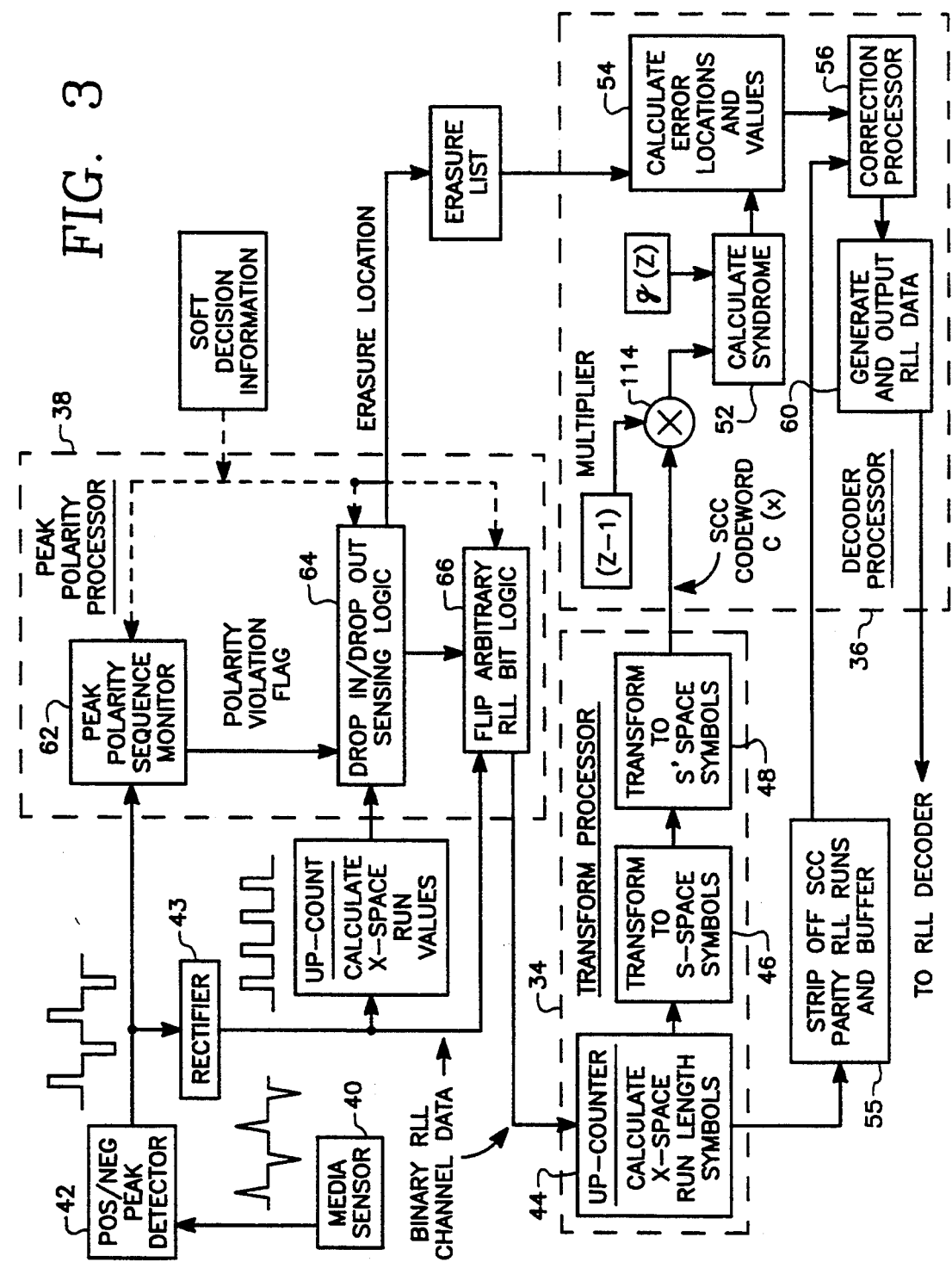
FIG. 3 is a block diagram illustrating the shift correction decoder embodying the present invention.

The decoder of FIG. 3 includes a transform processor 34 and a decoder processor 36. The transform processor 34 receives a shift correction encoded block of RLL data as played back from the media in accordance with the process of FIGS. 1a through 1f. The transform processor 34 converts each shift correction encoded block of RLL data into a block of s'-space symbols, using the same techniques employed in the encoder of FIG. 2. The decoder processor 36 treats the block of s'-space symbols as a received codeword and, using the code generator polynomial g(z), locates and calculates any errors in the received codeword. The decoder processor 36 converts these errors into an error vector and uses this vector in conjunction with the received message block of RLL data to correct any errors, therein. In this respect, the operation of the transform processor 34 and the decoder processor 36 is much the same as in the shift correction decoder described in the above-referenced patent application.

In order to correct additive errors, the decoder of FIG. 3 further includes a peak polarity processor 38 which senses the presence of additive errors in the playback RLL data. The processor 38 classifies each additive error as either a drop-in or a drop-out error and flags the affected code symbol location to the decoder processor 36 as an erasure. Further, the processor 38 modifies the RLL data before it is received by the transform processor 34 by inverting a bit in the additive error affected RLL run symbol to either remove a spurious 1 (in the case of a drop-in error) or add a missing 1 (in the case of a drop-out error).

In order to correct synchronization slips, the decoder processor 36 pre-multiplies the received codeword polynomial by a factor (namely, z-1) before locating and calculating any errors in the codeword. The advantage of this pre-multiplication is to simplify the error pattern in a codeword affected by a synchronization slip to permit correction thereof.

2. Transform Processor 34

A media sensor 40 generates the output signal of FIG. 1c from which a positive/negative peak detector 42 and rectifier 43 generate the signal of FIG. 1e, corresponding to the RLL data of FIG. 1f. The RLL data is processed by the processor 38 in a manner described below. The transform processor 34 includes an up-counter 44 which, like the up-counter 14 of FIG. 2, converts each block of N RLL binary sequence runs in the RLL data to a block of N x-space symbols. The block consists of K message symbols and r check symbols. An s-space transform processor 46 and an s'-space transform processor 48 perform transformations like those performed by the processors 16 and 18, respectively, of FIG. 2, to convert the N x-space message symbols to s'-space symbols. The message block of K s'-space symbols and the check block of r s'-space symbols thus produced form a received codeword.

3. Decoder Processor 36

The decoder processor 36 includes a syndrome calculator 52 which computes the syndrome of the received codeword with respect to the code generator polynomial g(z) using well-known techniques. An error processor 54 uses the syndrome to locate and calculate the values of errors in the received codeword, in accordance with a conventional algorithm. Furthermore, the error processor 54 responds to erasure flags from the peak polarity processor 38 to establish known error locations in setting up its algorithm, using well-known techniques. Specifically, the known erasure locations are treated as coefficients of an error location polynomial which is refined over successive iterations of the conventional error correction algorithm employed by the error processor 54.

A buffer 55 strips off the check block and stores the message block of x-space symbols from the up counter 44. Once the error processor 54 has located all of the errors in the received codeword and calculated the values of all of the errors and erasures, a correction processor 56 superimposes these values on the corresponding run symbols of the received codeword (obtained from the buffer 55) to produce corrected run (x-space) symbols. An output processor 60 transforms these x-space symbols to a received message block of K runs of RLL data, i.e., it produces a corrected stream of RLL data.

4. Peak Polarity Processor 38

Excepting the use of erasure flags and the expansion of the shift correction code's symbol alphabet from GF(3) to GF(p) (where $p \geq k-d+1$), as described above, the transform processor 34 and the decoder processor 36 are both structurally similar to the corresponding elements of the shift correction decoder first described in the above-referenced patent application by Dennis George Howe, et al. However, the shift correction decoder of the present invention comprises, in addition, a peak polarity processor 38 which detects and flags the locations of additive errors in the received RLL data, discriminates between drop-in and drop-out additive errors and modifies the received RLL data appropriately before sending it to the transform and decoder processors 34 and 36.

The peak polarity processor 38 includes a peak polarity sequence monitor 62 which senses any break in the alternating sequence of positive and negative peaks in the output signal of FIG. 1c received from the media sensor 40. As discussed above, if the media sensor is magnetic, then the signal of FIG. 1c monitored by the monitor 62 is inherent in the sensor output, while if the media sensor is optical, then the signal of FIG. 1c is a time-differentiated version of the media sensor output signal. If the monitor 62 senses a pair of successive peaks (or 1's) having the same polarity, it generates a polarity violation flag.

A drop-in/drop-out sensing logic circuit 64 responds to any polarity violation flag from the monitor 62 by determining whether the violation signifies a drop-in or a drop-out additive error. The logic circuit 64 also determines which pair of the N shift correction codeword run symbols represented by the RLL data is affected by the polarity violation, and transmits the location of the affected corresponding s'-space symbol to the decoder processor 36 as the erasure location discussed above in connection with the description of the decoder processor 36. The logic circuit 64 is described further below.

Depending upon which type of additive error the logic circuit 64 finds to be the cause of the polarity violation, an RLL data modifying logic circuit 66 flips an appropriate bit in the received binary RLL data (of FIG. 1f) to either remove a spurious "1" (in the case of a drop-in error) or add a missing "1" (in the case of a drop-out error). The RLL data thus modified, rather than the RLL data as originally received, is then sent to the transform processor 34.

Before describing the operation of the peak polarity processor 38 in detail, it will be useful to discuss the basis for the logic contained in it. We start by considering the effect of an additive drop-out error on a d,k-constrained sequence.

Let the input sequence have run values $$-x_0, x_1, -x_2, x_3, \ldots \quad (4)$$

where the minus signs indicate that negative playback signal peaks are associated with the 1-bits that begin the corresponding runs. If the run indicated as $-x_2$ suffers a dropout (i.e., the 1-bit at the lead of that run is detected as a 0-bit), sequence (4) becomes $$-x_0, x_1+x_2, x_3, \ldots \quad (5)$$

Moreover, the playback signal peaks associated with the 1-bits at the lead of the second and third runs of sequence (5) (i.e., the runs $x_1+x_2$ and $x_3$) will both be positive—a peak polarity violation. In what follows we shall assume that all runs in the additive error contaminated sequences obey the d,k-constraints of the RLL code (i.e., the run values lie between $d+1$ and $k+1$, inclusive), and we shall refer to the run that lies between the two contiguous peaks having the same polarity as the "framed" run and denote that run by the symbol $x_f$. Thus, the framed run of sequence (5) has value $$x_f = x_1 + x_2 \quad (6)$$

Now, since $x_1 \geq d+1$ and $x_2 \geq d+1$ and since $x_f$ obeys the d,k-constraints $$2(d+1) \leq x_f \leq k+1, \quad (7)$$

Thus, if $$x_f \leq 2d+1 \quad (8)$$

then a drop-out error is not possible (although a drop-in error could have occurred).

Next, we consider the effects of a drop-in error that is associated with a spurious playback signal peak that has the same polarity as the peak associated with the run in which the drop-in occurs. If such a drop-in were to affect the run $x_1$ of sequence (4), that sequence would become $$-x_0, x_1', x_1'', -x_2, x_3, \ldots \qquad (9)$$

and the framed run in sequence (9) would have the value $$x_f = x_1'. \qquad (10)$$

Now, since the drop-in occurred in the run $x_1$ it follows that $$x_1' + x_1'' = x_1 \qquad (11)$$

and therefore that $$d+1 \leq x_1' + x_1'' \leq k+1. \qquad (12)$$

Furthermore, since sequence (9) obeys the d,k-constraints $$d+1 \leq x_1', \qquad (13)$$

then (via inequalities (12) and (13))

$$d+1 \leq k+1 - x_1'' \leq k+1-(d+1)$$

which can be rewritten (using equation (10)) as $$d+1 \leq x_f \leq k-d. \qquad (14)$$

Inequality (14) implies that if $$x_f \geq k-d+1 \qquad (15)$$

a drop-in error is not possible (although a drop-out may have occurred).

To complete our assessment of the effects of additive errors on RLL sequences, we must consider the effect of a drop-in error that is associated with a spurious playback signal peak having polarity opposite the polarity of the peak associated with the run in which the drop-in occurs. If such a drop-in were to affect the run $x_1$ of sequence (4), that sequence would become $$-x_0, x_1^*, -x_1^{**}, -x_2, x_3 \qquad (16)$$

and the framed run would have the value $$x_f = x_1^{**}. \qquad (17)$$

Since this drop-in occurred in run $x_1$ of sequence (4) it follows that $$x_1^* + x_1^{**} = x_1 \qquad (18)$$

and therefore that $$d+1 \leq x_1^* + x_1^{**} \leq k+1 \qquad (19)$$

and, since sequence (16) obeys the d,k-constraints, then $$d+1 \leq x_1^{**}. \qquad (20)$$

Using inequalities (19) and (20) we obtain $$d+1 \leq x_1^{**} \leq k+1 - x_1^* \geq k+1 - (d+1) = k-d$$

which can be rewritten (using equation (17)) as $$d+1 \leq x_f \leq k-d. \qquad (21)$$

This last result is identical to inequality (14). Therefore, inequality (15) and the conclusions drawn from it hold for this type of drop-in error as well.

The knowledge contained in inequalities (8) and (15) can be summarized as follows:

if $x_f > 2d+1$ a drop-out is possible,
if $x_f \leq 2d+1$ a drop-out is not possible,
if $x_f < k-d+1$ a drop-in is possible, and
if $x_f \geq k-d+1$ a drop-in is not possible.

Thus, we can state that if $$x_f > 2d+1 \text{ and } x_f \geq k-d+1 \qquad (22)$$

a drop-out has occurred, and if $$x_f \leq 2d+1 \text{ and } x_f < k-d+1 \qquad (23)$$

a drop-in has occurred.

Thus far our discussion of the effects of drop-outs and drop-ins on d,k-constrained sequences has shown that we can use $x_f$, the value of the framed run that occurs when two consecutive playback signal peaks have identical polarity, to determine whether a drop-in or drop-out error caused the normal alternating sequence of peak polarities to be disrupted. However, this can be done unambiguously only for certain values of d,k. To see this we need only recognize that the inequalities (8) and (15), which govern the process, must both be simultaneously satisfied, i.e., it is required that $$k-d+1 \leq x_f \leq 2d+1,$$

which can be restated as $$k-d+1 < x_f < 2d+2,$$

or equivalently as $$k+1 < 3(d+1). \qquad (24)$$

Equation (24) specifies the RLL code d,k-constraints for which our method provides unambiguous determination of the type of additive error (i.e., drop-out or drop-in) that produced a framed run. The maximum value of k that is allowed by inequality (24) is listed for various values of d in Table I.

TABLE I $k_{max}$ vs. d, where $k_{max}$ is the largest value of k that satisfies $k + 1 < 3(d + 1)$

| d | $k_{max}$ |
|---|---|
| 1 | 4 |
| 2 | 7 |
| 3 | 10 |
| 4 | 13 |

An example of how inequality (24) limits the application of our method is given in table II, which lists the results of using expressions (22) and (23) to relate the type of additive error to particular values of $x_f$ that may occur in various isolated additive error contaminated 2,k-constrained binary sequences. We note that Table II only considers additive error events which do not produce d,k-constraint violations, i.e., it lists the results of applying expressions (22) and (23) only when $d+1 \leq x_f \leq k+1$; if $x_f > k+1$ the additive error must be a drop-out and if $x_f < d+1$ the additive error must be a drop-in. Table II shows that, when $k \leq k_{max}$, whether the additive error is a drop-in or drop-out is unambiguously determined; if $k > k_{max}$ there is ambiguity in this determination when the value of $x_f$ is near $k-d$. Thus, our method is totally reliable only if the RLL sequence has d,k-constraints that obey inequality (24).

A final point to be made about our method of using observed $x_f$ values to determine the type of additive error concerns the nature of the playback waveform peak detection process that is used to determine the presence of sequential peak polarity violations, which in turn are used to flag, or detect, the additive error events. The peak detection used is "conventional" hard, decision peak detection (i.e., like that employed in current data storage devices), in the sense that only "well-qualified" playback signal peaks that are reliably detected are input to the peak polarity processor (block 38 of FIG. 3). In essence, the peak polarity processor inserts missing peaks at their approximately correct locations and/or removes spurious peaks, or legitimate peaks that occur within $k-d+1$ channel bits of a spurious peak in the playback signal and simultaneously alerts the shift error correction decoder processor (block 36 of FIG. 3) of the locations at which such insertions/deletions occurred. The performance of this entire error detection/correction system could be enhanced (e.g., the coding overhead and/or the magnitude of the modulus p might be reduced) if soft decision information could be used to more accurately determine where the 1-bits used to compensate drop-out errors should be inserted and/or which 1-bit in the neighborhood of a detected drop-in should be changed to a 0-bit. The details of the soft decision algorithm to be used to accomplish this would depend strongly upon the characteristics of the particular data recording system in which the invention is used, but in general the technique would involve quantizing the amplitude of the playback signal peaks (e.g., by employing several peak level thresholds) and selecting certain "most likely" peaks from a sequence of peaks having varying amplitudes.

As one simple example of such a soft decision algorithm, whenever the peak polarity processor 38 detects a drop out error between two known (well-qualified) successive signal peaks, it searches for the location of the highest sub-threshold (i.e. not qualified) opposite polarity signal peak between the two known signal peaks and inserts the "missing" one bit at the corresponding location in the RLL data. Similarly, whenever the peak polarity processor 38 detects a drop in error, in which two successive signal peaks have the same polarity, it deletes the one of lesser peak amplitude. In one embodiment, this would be accomplished in the peak polarity processor 38 by monitoring and rank-ordering the amplitudes of the peaks in the signal through the peak detector 42. The peak detector 42 would provide hard information comprising the polarities of signal peaks above a certain threshold as well as the relative signal peak amplitudes as a function of time.

TABLE II

Illustration of the Results of Using Expressions (22) and (23) to Test for Drop-in/Drop-Out Error Events in 2,k RLL Sequences ($k_{max} = 7$)

| d,k | 2d + 1 | k − d + 1 | Value of $x_f$ | | | | | | | |
|-----|--------|-----------|---|---|---|---|---|---|---|---|
| | | | 3 | 4 | 5 | 6 | 7 | 8 | 9 | 10 |
| 2,9 | 5 | 8 | IN | IN | IN | ? | ? | OUT | OUT | OUT |
| 2,8 | 5 | 7 | IN | IN | IN | ? | OUT | OUT | OUT | OUT |
| 2,7 | 5 | 6 | IN | IN | IN | OUT | OUT | OUT | | |
| 2,6 | 5 | 5 | IN | IN | V | OUT | OUT | | | |
| 2,5 | 5 | 4 | IN | V | V | OUT | | | | |

Figure 4:
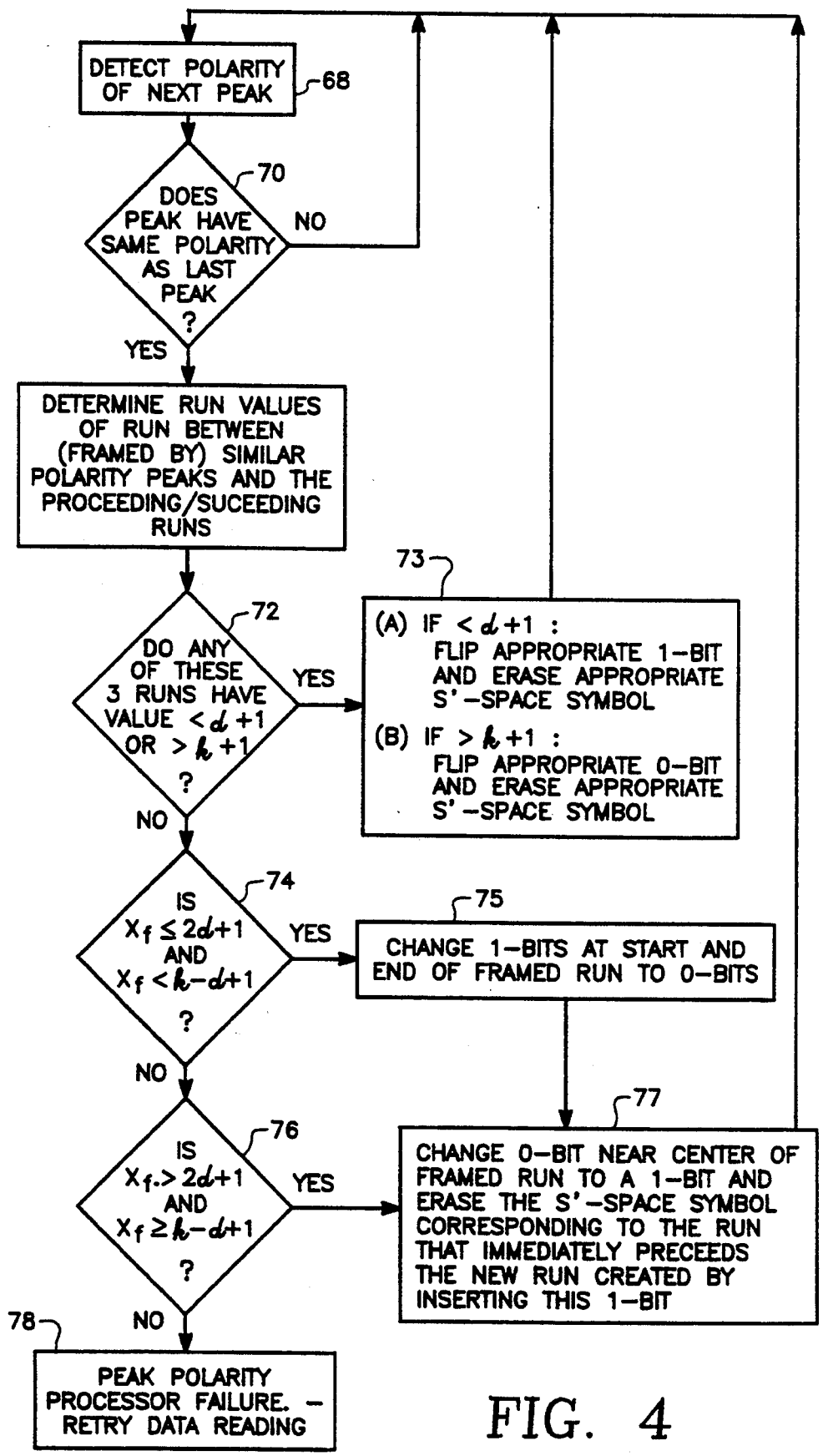
FIG. 4 is a flow diagram illustrating the decision logic implement by the peak polarity processor of the shift correction decoder of FIG. 3.

LEGEND:
IN = drop-in occurred
OUT = drop-out occurred
? = don't know
v = this value of $x_f$ will cause a d,k-constraint violation in an adjacent run The operation of the peak polarity sequence monitor 62, the drop-in/drop-out sensing circuit 64 and the RLL data modifying circuit 66 is illustrated in the flow diagram of FIG. 4, representing the operation of the peak polarity processor 38 as a whole. Referring to FIG. 4, the process begins as the monitor 62 senses the polarity of each peak (or "1") in the signal received from the positive/negative peak detector 42 (block 68 of FIG. 4). For each received peak, the monitor 62 determines whether the previous peak had the same polarity (block 70 of FIG. 4). If so (YES branch of block 70), the monitor 62 enables the drop-in/drop-out sensing logic circuit 64.

The sensing logic circuit 64, when enabled, proceeds to determine the type of additive error present. First, a determination is made at block 72 of FIG. 4 whether any one of three RLL runs in the neighborhood of the peak polarity violation (specifically, the run between, or "framed" by, the pair of peaks having the same polarity, and the runs immediately preceding and succeeding it) have values that are (A) less than $d+1$ or (B) greater than $k+1$ (where d and k are the RLL code's constraints). If so (YES branch of block 72), then either (A) the 1-bit causing a run value $<d+1$ is changed to a 0-bit and the s'-space symbol corresponding to the run that immediately precedes the newly created elongated run is erased, or (B) a 0-bit near the center of the run having value $>k+1$ is changed to a 1-bit and the s'-space symbol corresponding to the run immediately preceding the run created by the inserted 1-bit is erased ( block 73 of FIG. 4).

If none of the runs in the neighborhood of the peak polarity violation have prohibited values (NO branch of block 72), the logic circuit 64 determines whether the length $x_f$ of the run symbol framed by the peak polarity violation in the received playback signal is less than or equal to $2d+1$ and less than $k-d+1$ (block 74 of FIG. 4). If this condition is met (YES branch of block 74), then the additive error was a drop-in error and the RLL data modifying circuit 66 changes both 1-bits corresponding to the two successive peaks having identical polarity to 0-bits which, in effect, changes the drop-in to a drop-out (block 75, FIG. 4). The drop-out thus created is then processed as described below (via block 77, FIG. 4).

If block 74 of FIG. 4 is exited via its NO branch, the logic circuit 64 checks whether the framed run length $x_f > 2d+1$ and $x_f \leq k-d+1$. If so (YES branch of block 76 of FIG. 4), then there is a drop-out error and the RLL data modifying logic 66 flips a 0-bit near the center of the framed run (taking care not to produce a run of value $<d+1$) and erases the s'-space symbol corresponding to the run immediately proceeding the new run formed by flipping the 0-bit (block 77 of FIG. 4). If logic block 76 is exited via its NO branch, a peak polarity processing error is declared and some data recovery strategy (such as a re-read operation) is invoked (block 78 of FIG. 4). Erasing a symbol means indicating an erasure at the corresponding symbol location to the error processor 54.

As was mentioned previously, the logic illustrated in FIG. 4 is only valid if the RLL code's d,k-constraints satisfy inequality (1) stated previously herein. Thus, for a given d, the technique can only be used if $k \leq k_{max}$ is the largest value of k that satisfies inequality (1). If $k \leq k_{max}$ holds for the RLL code being used, then (assuming all transmitted runs obey the d,k-constraints) whether a drop-in or drop-out has occurred can be determined by examining the run length $x_f$ of the run that is "framed" by the two contiguous playback signal peaks having identical polarity.

Selected examples of the peak polarity processing operations described in FIG. 4 are given in FIGS. 5-7. FIG. 5 illustrates the processing of a drop-out that occurs at run $-x_2$ (the third run) of the transmitted RLL sequence. The minus sign refers to the peak polarity. We note that the processed run sequence (namely, the sequence $-3, 5, -5, 5$) that exits the peak polarity processor 38 essentially contains a single shift error and that the resulting s-space sequence is incorrect at its second element (namely, 8 vs. 9). This happened because the peak polarity processor 38 recognized that either a d,k-constraint violation occurred in the received run sequence (via block 72 of FIG. 4), or alternatively if $k_{max} \leq 10$, it recognized that a drop-out had occurred (via block 76 of FIG. 4); in either case it changed a 0-bit at the center of the second received run to a 1-bit (thereby creating a new run) and erased the s'-space symbol corresponding to the run immediately preceding the new run that was created (and this erasure correctly identifies the second s-space symbol, namely, $s_x$ in FIG. 5, as being erroneous).

FIGS. 6 and 7 illustrate the processing of the two possible types of drop-in errors. In both of these cases a drop-in occurs in the second transmitted run (i.e., $x_1$) and the processor identifies it (via block 74 of FIG. 4), changes the 1-bits that occur at the beginning and end of the framed run to 0-bits and then processes the resulting run sequence as a sequence containing a drop-out.

The most pathologic of the illustrated cases is the one of FIG. 7. From this illustration we see that the erroneous s-space symbol (computed by the transform processor, block 34 of FIG. 3) from the altered data output from the peak polarity processor could be in error by a magnitude as large as $\pm(2^{k-d})$. Thus, the symbol space of the shift correction code required to correct this error must have an alphabet size $p \leq k-d+1$.

In order to be able to correct as many as $e_s$ single shift errors and $e_a$ additive errors in each shift correction codeword represented by the modified RLL data thus generated by the peak polarity processor 38, the shift correction code employed and processed by the decoder processor 36 must have a redundancy (number of check symbols r per N-symbol codeword) so that the minimum distance $d_{min}$ of the shift correction code satisfies the requirement of inequality (2) previously stated above.

(D) Correction of Synchronization Slips

As understood in this specification, the term "synchronization slip" refers to a miscounting of the number of 0-bits within an RLL run symbol. If the miscounted number is less than the number originally transmitted, the error is called a synchronization-loss, while if the miscounted number is greater then the error is a synchronization gain. In accordance with the present invention, synchronization slips are corrected using a shift correction code whose minimum length $d_{min}$ satisfies inequality (3) previously stated above by pre-multiplying the polynomial representing the received codeword by a factor $(z-1)$.

Thus, referring to FIG. 3, a Galois field multiplier 114, using well-known techniques, changes the symbols of the received codeword comprising the message and check blocks of s'-space symbols produced by the processor 48 in accordance with multiplication of the codeword polynomial by the factor $(z-1)$. As will be seen below, such pre-multiplication simplifies the error vector produced by the syndrome and error processors 52, 54, thus enabling correction of any combination of $e_a$ additive errors, $e_s$ shift errors and a synchronization slip in one shift correction codeword.

(E) Review of Principles of Additive Error Correction

The principle by which the invention corrects additive errors relies upon the nature of the transformation of the data from x-space to s'-space discussed previously. Generally, an alternating-polarity sequence of RLL data (corresponding to FIG. 1d) may be represented as:

$$x_0, -x_1, x_2, -x_3, \ldots$$

This sequence is transformed to the following symbol sequence in s-space:

$$s_0, s_1, s_2, s_3, \ldots$$

which in turn is transformed into the following symbol sequence in s'-space:

$$s'_0, s'_1, s'_2, s'_3, \ldots$$

As received or played back, the original x-space sequence may be corrupted by an additive error as follows:

$$x_0, -x_x, x_2+x_1-x_x, x_3, \ldots$$

This corrupted sequence is transformed into the following sequence of S-space symbols:

$$s_0, s_x, s_2, s_3, \ldots$$

which transform to the following sequence of s'-space symbols:

$$s'_0, s'_x, s'_2, s'_3, \ldots$$

Comparing the two s'-space sequences immediately above, it is seen that an additive error causes only a single erasure in the shift correction codeword. Because the s-space symbols are congruent to the s'-space symbols modulus p, we can only calculate each s-space symbol from the s' symbols to the nearest multiple of p. However, by choosing $$p \geq k - d + 1$$

the two following relationships $$(s_{j+1} + d + 1) \geq s_j \geq (s_{j-1} + k + 1) \text{ and } s'_j = s_j \bmod p$$

can be solved for $s_j$ given $s'_j$. This means that the s-space sequence $s_0, s_1, s_2, s_3, \ldots$ and the x-space sequence $x_0, -x_1, x_2, -x_3, \ldots$ can be reconstructed completely despite the additive error. This is so, provided the following criteria discussed previously are met in selecting the d,k-constrained RLL code:

$$k + 1 < 3(d + 1) \quad \text{(a)}$$

and in selecting the shift correction code:

$$p \geq k - d + 1 \quad \text{(b) and}$$

$$d_{min} > 2e_s + e_a. \quad \text{(c)}$$

Condition (a) is necessary in order for the sensing logic circuit 64 to be able to unambiguously discriminate between a drop-in and a drop-out error. Condition (b) is necessary in order for the error vector generated by the decoder processor 56 to specify any one of k-d+1 possible bit positions in an RLL symbol as being erroneous. Condition (c) is necessary for there to be sufficient number of check symbols per codeword to correct both shift errors and additive errors.

(F) Principles of Synchronization Slip Correction

The principle by which the invention corrects synchronization slips also relies upon the nature of the transformation of the data from x-space to s'-space discussed previously. Synchronization slips occur when the playback electronics miscounts the number of 0-bits in an RLL run symbol. For example, if the jth run in an RLL data sequence has a spurious extra 0-bit, then it may be represented as:

$$x_0, x_1, \ldots, x_{j-1}, x_j + 1, x_{j+1}, \ldots$$

The corresponding sequence of s-space symbols is:

$$s_0, s_1, \ldots, s_{j-1}, s_j + 1, s_{j+1} + 1, s_{j+2} + 1, s_{j+3} + 1, \ldots$$

in which the error propagates to all symbols following the symbol $sj_{j-1}$. Likewise, the s'-space symbol sequence is:

$$s'_0, s'_1, \ldots, s'_{j-1}, s'_j + 1, s'_{j+1} + 1, s'_{j+2} + 1, s'_{j+3} + 1, \ldots$$

in which the error propagates similarly. As a consequence, the error polynomial has the following form in the case of a synchronization gain:

$$e(z)_{sg} = z^{j-1} + z^{j-2} + \ldots + z + 1$$

The error polynomial $e(z)_{sl}$ in the case of a synchronization loss is simply $-e(z)_{sg}$. Clearly, the shift correction code cannot correct an error pattern with so many error locations. However, the error polynomial is reduced to two terms (two error locations) if the received codeword is pre-multiplied by the factor $(z-1)$. The error pattern then becomes:

$$(z - 1) e(z) = z^j - 1.$$

However, such pre-multiplication doubles the number of errors due to a single shift error and the number of erasures due to a single additive error. In other words, a shift error now results in two adjacent errors of opposite sign in the sequence of s'-space symbols, while an additive error results in two adjacent erasures. However, as long as there are a sufficient number of check symbols in the shift correction codeword, all of these errors are corrected. Specifically, the number of check symbols r in each shift correction codeword of N symbols must be sufficient so that the minimum distance $d_{min}$ of the code satisfies the following inequality:

$$d_{min} > 2e_a + 4e_s + 4$$

in order to correct as many as $e_s$ shift errors, $e_a$ additive errors and one synchronization slip in the received codeword.

While the invention has been described in detail with specific reference to preferred embodiments thereof, it is understood that variations and modifications thereto may be made without departing from the true spirit and scope of the invention.

What is claimed is:

1. In a shift correction decoder for decoding data comprising d,k-constrained run length limited (RLL) symbols, each symbol comprising a start bit having a first bit value followed by a succession of run bits having a second bit value, said data previously encoded in accordance with a shift correction code whose GF(p) symbols are sums of values of said RLL symbols reduced modulus p, said decoder comprising means for transforming received ones of said RLL symbols into GF(p) symbols of said code to form a received codeword thereof and means for locating and calculating errors in said received codeword whereby to correct corresponding errors in said received RLL symbols, a soft decision processor comprising:

(1) discriminating means responsive whenever two successive start bits in data comprising a succession of said RLL symbols correspond to received signal peaks having the same polarity for determining whether said two successive start bits encompass a drop-in error or a drop-out error, respectively; and (2) data modifying means for increasing or decreasing, respectively, the number of start bits in said RLL data near one of said two start bits in response to said discriminating means sensing a drop-out or a drop-in error, respectively.

2. The processor of claim 1 further comprising means for flagging to said means for locating and calculating errors the location of an erroneous RLL symbol near said two start bits.

3. The processor of claim 1 wherein said data modifying means comprise:

means responsive whenever said discriminating means sense a drop-out error for converting a run bit in an RLL symbol between said two successive start bits to a start bit; and means responsive whenever said discriminating means sense a drop-in error for removing one of said two successive start bits.

4. The processor of claim 3 said means for removing one of said two successive start bits comprises means for converting both of said two successive start bits to run bits and then determining a drop-out error in the neighborhood of said two start bits and converting a run bit in said neighborhood to a start bit.

5. The processor of claim 1 wherein each of said RLL symbols has a run length between successive start bits, said run length constrained to lie between a minimum run length d and a maximum run length k, and wherein p is at least $k-d+1$, whereby said means for locating and correcting errors can specify an error in any bit of each of said RLL symbols.

6. The processor of claim 5 wherein the minimum and maximum run lengths, d and k respectively, of said RLL symbols are such that:

$$3(d+1) > k+1$$

whereby to permit said discriminating means to discriminate between drop-in and drop-out errors.

7. The processor of claim 6 wherein said discriminating means comprise:
means responsive whenever the run length between said two start bits of the same polarity in said received RLL data is one of: (a) less than $d+1$ and (b) less than 2d and less than $k-d+1$ for declaring to said data modifying means a drop-in error.

8. The processor of claim 6 wherein said discriminating means comprise:
means responsive whenever the run length between said two start bits of the same polarity in said received RLL data is one of: (a) greater than $k+1$ and (b) greater than $2d+1$ and greater than $k-d+2$ for declaring to said data modifying means a drop-out error.

9. The processor of claim 2 wherein said shift correction code has a minimum distance $d_{min} > 2e_s + e_a$, wherein said means for locating and correcting errors can correct any combination of as many as $e_s$ shift errors and $e_a$ additive errors in a single received codeword.

10. The processor of claim 3 wherein:
said means for converting one of said run bits to a start bit comprises means for selecting as the one bit to be converted a run bit whose conversion to a start bit will not create a new run symbol whose run length is less than d.

11. The processor of claim 3 wherein:
said means for removing one of said two start bits comprises means for determining which one of said two start bits may be removed without creating a run symbol whose length exceeds k.

12. The processor of claim 2 further comprising synchronization slip correction means for pre-multiplying said received codeword by an algebraic factor $(z-1)$.

13. The processor of claim 12 wherein said shift correction code has a minimum distance $d_{min} > 4e_s + 2e_a + 4$, whereby said means for locating and correcting errors can correct any combination of as many as $e_s$ shift errors, $e_a$ additive errors and a synchronization slip in the RLL data corresponding to one shift correction codeword.

14. The processor of claim 2 wherein said means for locating and correcting errors comprise means for iteratively constructing an error locator polynomial initially specifying the location of an erasure flagged by said means for flagging as a coefficient of said polynomial.

15. In a shift correction decoder for decoding data comprising d,k-constrained run length limited (RLL) symbols, each symbol comprising a start bit having a first bit value followed by a succession of run bits having a second bit value, said data previously encoded in accordance with a shift correction code whose GF(p) symbols are sums of values of said RLL symbols reduced modulus p, said decoder performing the steps of transforming received ones of said RLL symbols into GF(p) symbols of said code to form a received codeword thereof and locating and calculating errors in said received codeword whereby to correct corresponding errors in said received RLL symbols, a method of enabling correction of additive errors, said method comprising:
sensing whenever two successive start bits in RLL data comprising successive ones of said RLL symbols correspond to received signal peaks having the same polarity;
determining whether said two successive start bits encompass a drop-in error or a drop-out error, respectively;
decreasing or increasing, respectively, the number of start bits in said RLL data near one of said two start bits in response to said discriminating means; and
flagging as an erasure the location of an RLL symbol between said two start bits.

16. The method of claim 15 wherein the step of increasing or decreasing the number of start bits comprises:
whenever the determining step senses a drop-out error, converting a run bit in the RLL symbol between said two successive start bits to a start bit; and
whenever the determining step senses a drop-in error, removing one of said two successive start bits.

17. The method of claim 16 wherein the step of removing one of said two start bits comprises converting both of said two successive start bits to run bits and then determining a drop-out error in the neighborhood of said two start bits and converting a run bit in said neighborhood to a start bit.

18. The method of claim 15 wherein each of said RLL symbols has a run length between successive start bits, said run length constrained to lie between a maximum run length d and a maximum run length k, and wherein p is at least $k-d+1$, whereby the step of locating and correcting errors can locate and correct an error in any bit of each of said RLL symbols.

19. The method of claim 18 wherein the minimum and maximum run lengths, d and k respectively, of said RLL symbols are such that:

$$3(d+1) > k+1$$

whereby to enable the step of determining whether an error is a drop-in or a drop-out.

20. The method of claim 19 wherein the determining step comprises:
whenever the run length between said two start bits in said received RLL data is one of: (a) less than $d+1$ and (b) less than 2d and less than $k-d+1$, determining a drop-in error.

21. The method of claim 19 wherein the determining step comprises:

whenever the run length between said two start bits of the same polarity in said received RLL data is one of: (a) greater than k+1 and (b) greater than 2d+1 and greater than k−d+2, determining a drop-out error.

22. The method of claim 15 wherein said shift correction code has a minimum distance $d_{min} > 2e_s + e_a$, whereby the step of locating and correcting errors can correct any combination of as many as $e_s$ shift errors and $e_a$ additive errors in a single received codeword.

23. The method of claim 16 wherein:
the step of converting one of said run bits to a start bit comprises selecting as the one bit to be converted a run bit whose conversion to a start bit will not create a new run symbol whose run length is less than d.

24. The method of claim 16 wherein:
the step of removing one of said two start bits comprises determining which one of said two start bits may be removed without creating a run symbol whose length exceeds k.

25. The method of claim 15 further comprising:
pre-multiplying said received codeword by an algebraic factor (z−1).

26. The method of claim 25 wherein said shift correction code has a minimum distance $d_{min} > 4e_s + 2e_a + 4$, whereby the step of locating and correcting errors can correct any combination of as many as $e_s$ shift errors, $e_a$ additive errors and a synchronization slip in the RLL data corresponding to one shift correction codeword.

27. The method of claim 15 wherein the step of locating and correcting errors comprises iteratively constructing an error locator polynomial initially specifying the location of an erasure flagged by the flagging step as a coefficient of said polynomial.

28. The method of claim 16 wherein the step of converting a run bit to a start bit is preceded by selecting the run bit to be converted in accordance with a soft decision algorithm.

29. The method of claim 28 wherein said selecting step comprises sensing among all run bits between said two start bits one run bit corresponding to the greatest signal amplitude.

30. The method of claim 16 wherein the step of removing one of said two start bits is preceded by selecting the start bit to be removed in accordance with a soft decision algorithm.

31. The method of claim 30 wherein said selecting step comprises determining which one of said two start bits corresponds to the lowest signal amplitude.

* * * * *

UNITED STATES PATENT AND TRADEMARK OFFICE
CERTIFICATE OF CORRECTION

PATENT NO. : 5,373,513
DATED : Dec, 13, 1994
INVENTOR(S) : Dennis G. Howe, et al It is certified that error appears in the above-indentified patent and that said Letters Patent is hereby corrected as shown below:

In the ABSTRACT, line 17, "$p \leq k-d+1$" should read -- $p \geq k-d+1$ --.

Signed and Sealed this

Eighth Day of August, 1995

Attest:

BRUCE LEHMAN

*Attesting Officer*    *Commissioner of Patents and Trademarks*